(12) United States Patent
Tokura et al.

(10) Patent No.: US 7,633,723 B2
(45) Date of Patent: Dec. 15, 2009

(54) TUNNEL JUNCTION DEVICE HAVING OXIDE FERROMAGNETIC ELECTROCONDUCTIVE ELECTRODES AND THREE-LAYER STRUCTURE TUNNELING FILM

(75) Inventors: Yoshinori Tokura, Tsukuba (JP); Masashi Kawasaki, Tsukuba (JP); Hiroyuki Yamada, Tsukuba (JP); Yoshihiro Ogawa, Tsukuba (JP); Yoshio Kaneko, Chiba (JP)

(73) Assignees: National Institute of Advanced Industrial Science and Technology, Tokyo (JP); Japan Science and Technology Agency, Kawaguchi-shi (JP)

( * ) Notice: Subject to any disclaimer, the term of this patent is extended or adjusted under 35 U.S.C. 154(b) by 572 days.

(21) Appl. No.: 10/569,089

(22) PCT Filed: Jun. 4, 2004

(86) PCT No.: PCT/JP2004/008173

§ 371 (c)(1),
(2), (4) Date: Nov. 6, 2006

(87) PCT Pub. No.: WO2005/024968

PCT Pub. Date: Mar. 17, 2005

(65) Prior Publication Data

US 2007/0058302 A1    Mar. 15, 2007

(30) Foreign Application Priority Data

Aug. 27, 2003   (JP) .............................. 2003-302614

(51) Int. Cl.
*G11B 5/39*   (2006.01)
*G11C 11/00*  (2006.01)

(52) U.S. Cl. .................... 360/324.2; 257/421; 365/158

(58) Field of Classification Search ............... 360/324.2; 257/421–427; 365/145, 158, 171–173; 428/810–816
See application file for complete search history.

(56) References Cited

U.S. PATENT DOCUMENTS 6,110,751 A  *  8/2000  Sato et al. ...................... 438/3
6,760,201 B2 *  7/2004  Nakashio et al. ......... 360/324.2

FOREIGN PATENT DOCUMENTS

JP      2001-320108      11/2001

OTHER PUBLICATIONS

Ogimoto, Y. et al., Tunneling Magnetoresistance above room temperature in $La_{0.7}Sr_0MnO_3/SrTiO_3/La_{0.7}Sr_{0.3}MnO_3$ Junctions, Japanese Journal of Applied Physics., vol. 42, Part 2, No. 4A, pp. L369 to L372, 2003.
U.S. Appl. No. 10/591,246, filed Aug. 31, 2006, Tokura, et al.

* cited by examiner

*Primary Examiner*—A. J. Heinz
(74) *Attorney, Agent, or Firm*—Oblon, Spivak, McClelland, Maier & Neustadt, L.L.P.

(57) ABSTRACT

To provide a tunnel junction device having a high MR ratio even at room temperature, a tunneling film as a nonmagnetic layer of three-layer structure of $LaMnO_3/SrTiO_3/LaMnO_3$ is arranged between a ferromagnetic metal material $La_{0.6}Sr_{0.4}MnO_3$ (12) and a ferromagnetic metal film material $La_{0.6}Sr_{0.4}MnO_3$ (14). The tunneling film comprises two unit layers of $LaMnO_3$ (13A) arranged on the ferromagnetic metal material $La_{0.6}Sr_{0.4}MnO_3$ (12); five unit layers of $SrTiO_3$ (13B); and two unit layers of $LaMnO_3$ (13C) arranged at the interface between the $SrTiO_3$ (13B) and the ferromagnetic metal film material $La_{0.6}Sr_{0.4}MnO_3$ (14).

10 Claims, 2 Drawing Sheets

FIG. 3

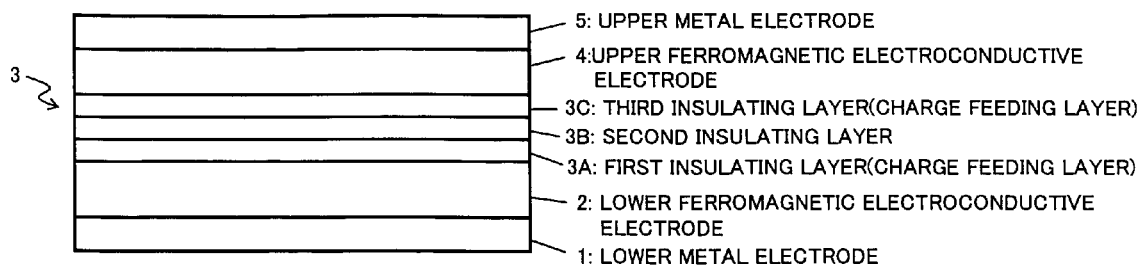

- 5: UPPER METAL ELECTRODE
- 4: UPPER FERROMAGNETIC ELECTROCONDUCTIVE ELECTRODE
- 3C: THIRD INSULATING LAYER(CHARGE FEEDING LAYER)
- 3B: SECOND INSULATING LAYER
- 3A: FIRST INSULATING LAYER(CHARGE FEEDING LAYER)
- 2: LOWER FERROMAGNETIC ELECTROCONDUCTIVE ELECTRODE
- 1: LOWER METAL ELECTRODE

FIG. 4

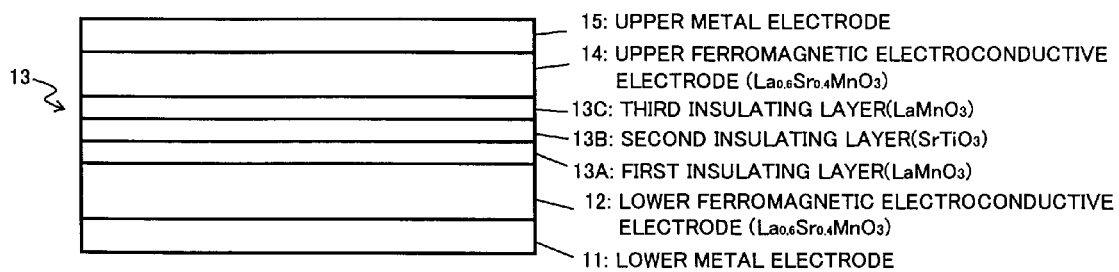

- 15: UPPER METAL ELECTRODE
- 14: UPPER FERROMAGNETIC ELECTROCONDUCTIVE ELECTRODE ($La_{0.6}Sr_{0.4}MnO_3$)
- 13C: THIRD INSULATING LAYER($LaMnO_3$)
- 13B: SECOND INSULATING LAYER($SrTiO_3$)
- 13A: FIRST INSULATING LAYER($LaMnO_3$)
- 12: LOWER FERROMAGNETIC ELECTROCONDUCTIVE ELECTRODE ($La_{0.6}Sr_{0.4}MnO_3$)
- 11: LOWER METAL ELECTRODE

FIG. 5

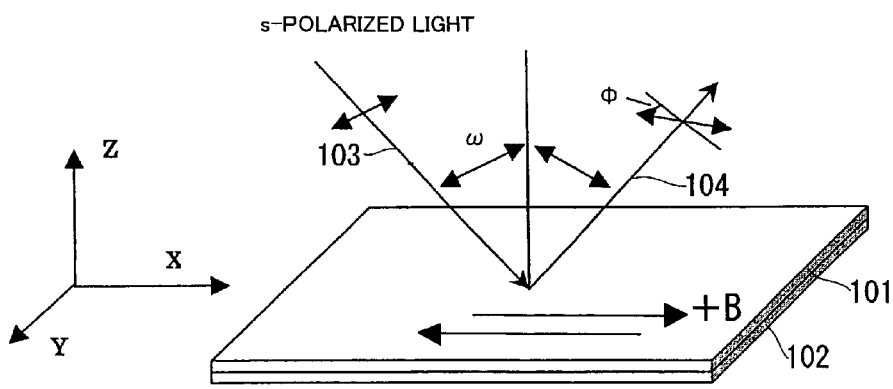

TUNNEL JUNCTION DEVICE HAVING OXIDE FERROMAGNETIC ELECTROCONDUCTIVE ELECTRODES AND THREE-LAYER STRUCTURE TUNNELING FILM

TECHNICAL FIELD

The present invention relates to tunnel junction devices and is applied to magnetic heads necessary to read out information stored by magnetization. This technique can also be applied to techniques relating to tunnel magnetoresistive (TMR) devices that can expand into magnetic memory devices.

BACKGROUND ART

Demands to increase storage capacity know no bounds, since technologies in information industry have been expanding and demands on storage, typically of images, have been increasingly made. Consequently, the size of memory is required to be minimized. It is now predicted that memory capacity of 100 gigabits per square inches can be achieved with a magnetic material size of about 30 nm (300 angstroms) in 2004, and memory capacity of 1000 gigabits per square inches can be achieved with a magnetic material size of about 10 nm (100 angstroms) in 2007.

To allow magnetic materials for storage to have a finer size and a higher density, the sensitivities of reproducing heads or magnetic sensors must be increased. The sensitivity is represented by MR ratio. Downsizing of reproducing heads have been achieved by increasing MR ratio of sensing elements constituting the reproducing heads.

Regarding the MR ratio, giant magnetoresistive (GMR) devices with MR ratio of 4% have been developed and brought into practice since around 1994. Those with MR ratio of about 10% are about to be released. At a storage density of 100 gigabits per square inches or more, however, the MR ratio of the GMR devices is still insufficient, and MR ratio of ten percent to several ten percent is required.

TMR devices having a MR ratio of 10% or more in development phase were achieved in 2000. The TMR devices could achieve a higher MR ratio that could not be achieved by the conventional GMR devices (Non-patent Document 1).

Such TMR devices can be applied not only as magnetic sensors but also as magnetic memories. IBM announced a joint development project for launching 256 megabit-MRAM on the market in 2004. Accordingly, the importance of the TMR devices is increasing.

[Patent Document 1] Japanese Unexamined Patent Application Publication No. 2003-86863

[Non-patent Document 1] Ohashi et al., NEC "Low Resistance Tunnel Magnetoresistive Head", IEEE Transaction on Magnetics, Vol. 36, No. 5, pp. 2549-2553, 2000

[Non-patent Document 2] M. Brown et al., App. Phys. 82 (2003) 233

[Non-patent Document 3] M. Kawasaki, Y. Tokura et al., J. Appl. Phys. Vol. 42 (2003) L369-L372

[Non-patent Document 4] U. Pustogowa et al., Phys. Rev. B49 (1994) 10031

[Non-patent Document 5] Th. Rasing et al., Phys. Rev. Lett. 74(1995) 3692 (J. Appl. Phys. 79 (1996), 6181)

DISCLOSURE OF INVENTION

The TMR devices are devices using spin-polarized tunneling magnetoresistance in a ferromagnetic tunnel junction. The ferromagnetic tunnel junction has a sandwich structure including a sufficiently thin insulator layer typically of $Al_2O_3$ sandwiched between ferromagnetic metal layers of a transition metal such as iron. Fundamental physical phenomena of TMR are caused by the fact that the probability of tunneling of conductive electrons through the barrier of the insulating layer varies depending on the spin directions of the upper and lower ferromagnetic layers. Above-mentioned Non-patent Document 2 demonstrates that a higher MR ratio than those of regular transition metals can be obtained by using a perovskite oxide in ferromagnetic metal layers constituting a TMR device. The MR ratio of the resulting TMR device is more than 1800% at 4 K. TMR devices of this type are called "colossal magnetoresistive (CMR) devices".

The CMR devices using a perovskite oxide in ferromagnetic metal layers are expected to have properties much higher than those of conventional TMR devices but have a low MR ratio at room temperature.

Under these circumstances, an object of the present invention is to provide a tunnel junction device having a high MR ratio even at room temperature.

The present inventors revealed the reason why the CMR devices do not show such a high MR ratio as expected at room temperature as follows (Non-patent Document 3). When an insulating layer is arranged between layers of a perovskite ferromagnetic electroconductive oxide for practical use of a CMR device, the resulting tunnel junction has a ferromagnetic transition temperature Tc lower than the ferromagnetic transition temperature Tc of the perovskite oxide by itself. The reduction in ferromagnetic transition temperature Tc is caused by the fact that the spin state at the interface between the insulating layer and the ferromagnetic metal material differs from the spin in a single ferromagnetic metal layer. The spin direction at the interface is determined by the competition between the interlayer antiferromagnetism (A-type layered antiferromagnetism) and the double exchange interaction enhancing the ferromagnetic coupling between spins in the ferromagnetic metal layers.

The present inventors have considered that the A-type layered antiferromagnetic properties occurring at the interface between the tunneling insulating layer and the ferromagnetic metal material are based on charge transfer between the tunneling insulating layer and the ferromagnetic metal. Based on this consideration, layers (films) for preventing the charge transfer from the insulating layer are arranged according to the present invention (Claim 1) to achieve the above object. Upper and lower layers for preventing charge transfer are necessary so as to sandwich a core insulating layer. The three-layered tunneling film including the core insulating layer must have a thickness of three unit layers or more, but an increasing thickness of the tunneling film prevents the tunneling current from decreasing. Accordingly, the tunneling film comprises three to ten unit layers (Claim 2). The layers for preventing charge transfer should each comprise a very thin film of a thickness of one to three unit layers (Claim 3). At least one of the three thin films can be a layer comprising an oxide of a transition metal (Claim 4). At least one of materials for the three thin films can be an $A_{1-x}B_xMO_{3-\delta}$ (perovskite) oxide, wherein X satisfies the condition: $0 \leq X \leq 1$; $\delta$ represents an oxygen deficiency; A represents an element selected from the group consisting of Ca, Sr, Ba, and other alkaline earth elements, La and other rare earth elements, Y, and Bi; B represents another element which is different from A, selected from the group consisting of Ca, Sr, Ba, and other alkaline earth elements, La and other rare earth elements, and oxides comprising Y and Bi; and M represents a transition metal such as Mn, Fe, Co, Ni, or Cu (Claim 5).

The core layer of the three layers constituting the tunneling film can comprise $SrTiO_{3-\delta}$ wherein $\delta$ represents an oxygen deficiency (Claim 6), and the upper and lower layers sandwiching the core layer can comprise $La_{1-x}Sr_xMnO_{3-\delta}$ wherein the content x of Sr satisfies the condition: $0 \leq X \leq 0.4$; and $\delta$ represents an oxygen deficiency (Claim 7). The ferromagnetic electroconductive layers can each comprise a $La_{1-x}Sr_xMnO_{3-\delta}$ oxide wherein X satisfies the condition: $0.2 \leq X \leq 0.5$; and $\delta$ represents an oxygen deficiency (Claim 8). The ferromagnetic electroconductive layers can each comprise an $A_2MM'O_{6-\delta}$ oxide wherein X satisfies the condition: $0 \leq X \leq 1$; $\delta$ represents an oxygen deficiency; A represents an element selected from the group consisting of Ca, Sr, Ba, and other alkaline earth elements, La and other rare earth elements, and oxides comprising Y and/or Bi; M represents a transition metal element such as Mn, Fe, Co, Ni, or Cu; and M' represents another transition metal element such as Mn, Fe, Co, Ni, or Cu, M' being different from M (Claim 9). At least one of materials constituting the ferromagnetic electroconductive electrodes and the tunneling film can be prepared by a laser abrasion process (Claim 10).

BRIEF DESCRIPTION OF THE DRAWINGS

FIG. 3 is a schematic sectional view of a tunnel junction device according to the present invention.

FIG. 4 is a sectional view of a tunnel junction device according to an embodiment of the present invention.

FIG. 5 is a diagram illustrating the principle of an observation method of spin state at the interface using the second harmonic.

BEST MODE FOR CARRYING OUT THE INVENTION

Figure 1:
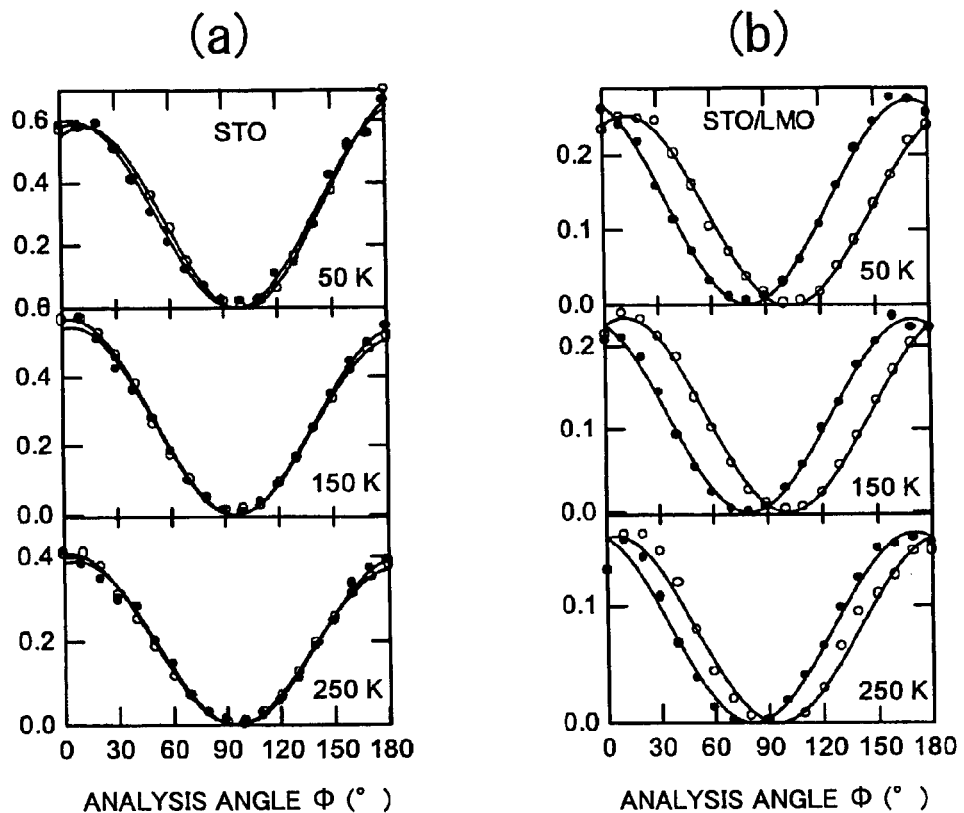
FIG. 1 shows diagrams indicating the relationship between layers constituting a superlattice CMR device and the arrangement of laser beams.

According to the present invention, the following advantages can be obtained.

Specifically, the present invention can provide a magnetic sensor having a sufficiently high MR ratio at room temperature, which cannot be achieved by conventional CMR devices. For example, it can provide a magnetic head usable at a recording density of 100 gigabits per square inches to 1000 gigabits per square inches and provide a CMR device having properties as a constitutional element for magnetic memories, equivalent to DRAMs and FeRAMs.

The tunnel junction device comprises a lower ferromagnetic electroconductive electrode, an upper ferromagnetic electroconductive electrode, and a tunneling film arranged between the upper and lower electrodes. The tunneling film comprises three electrically insulating layers. The ferromagnetic electroconductive electrodes each comprise an $A_{1-x}B_xMO_{3-\delta}$ oxide, wherein X satisfies the condition: $0 \leq X \leq 1$; $\delta$ represents an oxygen deficiency; A represents an element selected from the group consisting of Ca, Sr, Ba, and other alkaline earth elements, La and other rare earth elements, elements comprising Y and Bi; B represents another element which is different from A, selected from the group consisting of Ca, Sr, Ba, and other alkaline earth elements, La and other rare earth elements, and oxides comprising Y and Bi; and M represents a transition metal such as Mn, Fe, Co, Ni, or Cu. In other words, the tunnel junction device comprises the ferromagnetic electroconductive electrodes and the tunneling film being arranged between the ferromagnetic electroconductive electrodes. The tunneling film comprises three electrically insulating layers including upper and lower layers capable of feeding charges, and a core layer arranged between the upper and lower layers.

EMBODIMENTS (1) FIG. 3 is a schematic sectional view of a tunnel junction device according to the present invention.

In FIG. 3, reference numeral 1 denotes a lower metal electrode; reference numeral 2 denotes an $A_{1-x}B_xMO_{3-\delta}$ oxide film ($0 \leq X \leq 1$; $\delta$ represents an oxygen deficiency) [lower ferromagnetic electroconductive electrode] formed thereon; reference numeral 3 denotes a tunneling film (insulating film) comprising a first insulating layer 3A, a second insulating layer 3B, and a third insulating layer 3C; reference numeral 4 denotes an $A_{1-x}B_xMO_{3-\delta}$ oxide film ($0 \leq X \leq 1$; $\delta$ represents an oxygen deficiency) [upper ferromagnetic electroconductive electrode] formed on the third insulating layer 3C; and reference numeral 5 denotes an upper metal electrode formed on the upper ferromagnetic electroconductive electrode 4.

(2) In the tunnel junction device, the three-layered tunneling film (insulating film) 3 comprising the first insulating layer 3A, the second insulating layer 3B, and the third insulating layer 3C sandwiched between the lower ferromagnetic electroconductive electrode 2 and the upper ferromagnetic electroconductive electrode 4 has a total thickness of three to ten unit layers.

(3) In the tunnel junction device, the upper and lower layers constituting the three-layered tunneling film (insulating film) 3 arranged between the lower ferromagnetic electroconductive electrode 2 and the upper ferromagnetic electroconductive electrode 4, i.e., the first insulating layer 3A and the third insulating layer 3C each have a thickness of one to three unit layers.

(4) At least one of layers constituting the tunneling film in the tunnel junction device can comprise an oxide film of a transition metal such as Mn, Fe, Co, Ni, or Cu.

(5) At least one of layers constituting the tunneling film in the tunnel junction device can comprise an $A_{1-x}B_xMO_{3-\delta}$ oxide wherein X satisfies the condition: $0 \leq X \leq 1$; $\delta$ represents an oxygen deficiency; A represents an element selected from the group consisting of Ca, Sr, Ba, and other alkaline earth elements, La and other rare earth elements, elements comprising Y and Bi; B represents another element which is different from A, selected from the group consisting of Ca, Sr, Ba, and other alkaline earth elements, La and other rare earth elements, and oxides comprising Y and Bi; and M represents a transition metal such as Mn, Fe, Co, Ni, or Cu.

(6) In the tunnel junction device, the core layer of the three insulating layers constituting the tunneling film, i.e., the second insulating layer 3B comprises $SrTiO_{3-\delta}$ wherein $\delta$ represents an oxygen deficiency.

(7) In the tunnel junction device, the core layer of the three layers constituting the tunneling film, i.e., the second insulating layer 3B comprises $SrTiO_{3-\delta}$ wherein $\delta$ represents an oxygen deficiency, and the upper and lower layers sandwiching the second insulating layer, i.e., the first insulating layer 3A and the third insulating layer 3C each comprise a $La_{1-x}Sr_xMnO_{3\delta}$ wherein the content x of La satisfies the condition: $0 \leq X \leq 0.4$; and $\delta$ represents an oxygen deficiency.

(8) In the tunnel junction device, the lower ferromagnetic electroconductive electrode 2 and the upper ferromagnetic electroconductive electrode 4 each comprise a $La_{1-}$ $x$Sr$_x$MnO$_{3\delta}$ oxide, wherein X satisfies the condition: $0.2 \leq X \leq 0.5$; and δ represents an oxygen deficiency.

(9) In yet another embodiment of the tunnel junction device, the lower ferromagnetic electroconductive electrode 2 and the upper ferromagnetic electroconductive electrode 4 each comprise an A$_2$MM'O$_{6-\delta}$ oxide, wherein X satisfies the condition: $0 \leq X \leq 1$; δ represents an oxygen deficiency; A represents an element selected from the group consisting of Ca, Sr, Ba, and other alkaline earth elements, La and other rare earth elements, and oxides comprising Y and Bi; M represents a transition metal element such as Mn, Fe, Co, Ni, or Cu; and M' represents another transition metal element such as Mn, Fe, Co, Ni, or Cu, M' being different from M.

(10) In the tunnel junction device, at least one of materials for the ferromagnetic electroconductive electrodes and the layers constituting the tunneling film including the first insulating layer 3A, the second insulating layer 3B, and the third insulating layer 3C can be prepared by a laser abrasion process.

FIG. 4 is a schematic view of a tunnel junction device according to an embodiment of the present invention.

In FIG. 4, reference numeral 11 denotes a lower metal electrode; reference numeral 12 denotes a ferromagnetic metal material La$_{0.6}$Sr$_{0.4}$MnO$_3$ as a lower ferromagnetic electroconductive electrode formed on the lower metal electrode; reference numeral 13 denotes a tunneling film (insulating film) including two unit layers of single unit layer of LaMnO$_3$ as a first insulating layer 13A, five unit layers of SrTiO$_3$ as a second insulating layer 13B, and a two unit layers of LaMnO$_3$ as a third insulating layer 13C; reference numeral 14 denotes a ferromagnetic metal film material La$_{0.6}$Sr$_{0.4}$MnO$_3$ as an upper ferromagnetic electroconductive electrode formed on the third insulating layer 13C; and reference numeral 15 denotes an upper metal electrode.

As described above, the tunneling film as a nonmagnetic film of three-layer structure of LaMnO$_3$/SrTiO$_3$/LaMnO$_3$ is arranged between the ferromagnetic metal material La$_{0.6}$Sr$_{0.4}$MnO$_3$ 12 and the ferromagnetic metal film material La$_{0.6}$Sr$_{0.4}$MnO$_3$ 14. The tunneling film comprises two unit layers of LaMnO$_3$ 13A arranged on the ferromagnetic metal material La$_{0.6}$Sr$_{0.4}$MnO$_3$ 12; five unit layers of SrTiO$_3$ 13B; and two unit layers of LaMnO$_3$ 13C arranged between the SrTiO$_3$ 13B and the ferromagnetic metal film material La$_{0.6}$Sr$_{0.4}$MnO$_3$ 14. These tunneling film 13, the ferromagnetic metal layers 12 and 14 are laminated by a laser abrasion process. The film formation herein is carried out under the conditions at 850° C. to 900° C. and 0.1 to 1 mTorr. One unit layer of the SrTiO$_3$ 13B has a thickness of 3.905 angstroms, and one unit layer of the LaMnO$_3$ 13C has a thickness of 3.960 angstroms. The number of layers constituting these films was determined by reflective high-energy electron diffraction (RHEED) observation.

Measurement example of the deflection angle of the second harmonic (SHG) is shown below. The measurement is performed under the condition of reflection intensity of the second harmonic (SHG) being 3.1 eV at an incident energy of 1.55 eV, an incident angle of 26°, and a sample temperature of 50 K to 350 K. The SHG light is separated from the exciting light using an optical filter and a spectrometer and is measured using a photomultiplier and a boxcar integrator.

FIG. 5 is a diagram illustrating the principle of an observation method of spin state at the interface using the second harmonic [MSHG (magnetic second harmonic generation) method].

As is shown in FIG. 5, the interface under test comprises a nonmagnetic transparent film 101 and a ferromagnetic film 102. The nonmagnetic transparent film comprises SrTiO$_3$ as a comparative example of conventional material and SrTiO$_3$/LaMnO$_3$ as an example of the present invention. The ferromagnetic film comprises La$_{0.6}$Sr$_{0.4}$MnO$_3$ both in the comparative example and the example of the present invention. According to the MSHG method, laser light 103 with frequency ω is incident at an incident angle ω, and the rotation of polarization plane of light with frequency 2ω of the resulting reflected light 104ω is determined.

The susceptibility χ(2) of the second harmonic in this arrangement is expressed as χ(2)=αMxPz. The polarizability Pz occurs due to the presence of the interface, and the magnetization Mx in the x-axis direction induces χ(2). The rotation angle of the polarization plane is proportional to the magnitude of the resulting interface magnetization. The rotation of the polarization plane of the second harmonic from the magnetic interface was theoretically predicted by Pustogowa et al. in an Fe magnetic metal thin film (Non-patent Document 4) and was observed by Rasing et al. in an Fe/Cr film formed by sputtered film (Non-patent Document 5).

Figure 2:
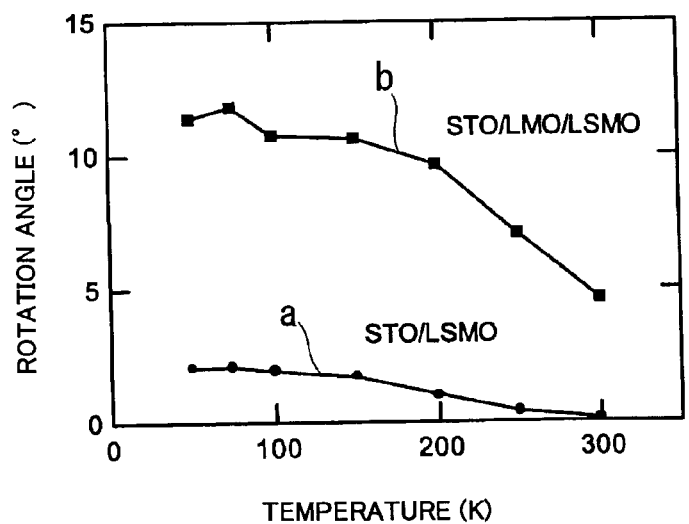
FIG. 2 is a diagram showing the rotation (data) angle of a plane of polarization of the second harmonic in layers constituting a superlattice CMR device.

In FIG. 1, FIG. 1(*a*) shows the degree of deflection of SHG light at B of +500 gauss and B of −500 gauss in a tunneling film using SrTiO$_3$. Such SrTiO$_3$ has been conventionally used in CMR devices. FIG. 1(*b*) shows the degree of deflection of SHG light in a SrTiO$_3$/LaMnO$_3$ tunneling film in the tunnel junction device of the present invention. These Figures apparently demonstrate that the deflection of the SHG light occurs up to higher temperatures in the SrTiO$_3$/LaMnO$_3$ tunneling film than in the SrTiO$_3$ tunneling film. FIG. 2 shows the degree of deflection of the SHG light within the range of 50 K to 350 K.

At 300 K equal to or higher than room temperature, the SHG light disappears when the tunneling film comprises SrTiO$_3$ (the graph a in FIG. 2), while the SHG light remains 40 percent of that at a low temperature of 50 K when the tunneling film is according to the present invention (the graph b in FIG. 2). This indicates that a CMR device having a MR ratio of 40 percent of that at a low temperature (e.g., 4.2 K) can be realized. Specifically, this shows that a MR ratio of 720% at room temperature can be achieved, since a MR ratio of 1800% is achieved at 4.2 K, and 40 percent of 1800%, i.e., 720% can be achieved at room temperature. These data show that the occurrence of A-type layered antiferromagnetism between the upper and lower electroconductive electrodes can be successfully suppressed by forming one or two unit layers of charge feeding layers so as to sandwich a conventional tunneling film, and that the LaMnO$_3$/SrTiO$_3$/LaMnO$_3$ tunneling film is expected to have a sufficient MR ratio of 700% or more at room temperature.

The novel CMR devices according to the present invention enable to provide high-performance magnetic sensors that operate at room temperature and have a MR ratio of 700 or more. This can provide immense magnetic memory devices of 100 gigabits up to the order of terabits and provide immense memories suitable for bearing information communications handling immense information in future. The novel CMR devices according to the present invention can be applied not only to magnetic sensors but also to magnetic memory devices which are now rapidly being developed. They can be possibly applied to oxide films for capacities of DRAM devices, since the tunneling current passing through such oxide film can be dramatically reduced by holding the directions of spins of materials for the ferromagnetic electroconductive electrodes in antiparallel state. When micromagnets and the above-proposed magnetic sensor are arranged so as to face each other, the resulting article can be applied as open/close sensors such as those for mobile phones, since the CMR devices can detect a magnetic field in a microdomain.

Thus, the present invention can be possibly applied not only to magnetic memories but also to elementary elements in broad information networks.

It is to be understood that the present invention is not limited to the embodiments as mentioned above, and various modifications and variations can be made in accordance with the sprit of the invention and are included within the scope of the invention.

INDUSTRIAL APPLICABILITY

The tunnel junction devices of the present invention are suitable for high-performance magnetic sensors that have a MR ratio of 700 or more and can operate at room temperature.

The invention claimed is:

1. A tunnel junction device, comprising ferromagnetic electroconductive electrodes and a tunneling film arranged between the ferromagnetic electroconductive electrodes, the ferromagnetic electroconductive electrodes each comprising an $A_{1-x}B_xMO_{3-\delta}$ oxide, wherein X satisfies the condition: $0 \leq X \leq 1$; $\delta$ represents an oxygen deficiency; A represents an element selected from the group consisting of Ca, Sr, Ba, and other alkaline earth elements, La and other rare earth elements, elements comprising Y and Bi; B represents another element which is different from A, selected from the group consisting of Ca, Sr, Ba, and other alkaline earth elements, La and other rare earth elements, and oxides comprising Y and Bi; and M represents a transition metal such as Mn, Fe, Co, Ni, or Cu, and wherein the tunneling film has a three-layer structure of upper and lower layers capable of feeding charges; and a core layer arranged between the upper and lower layers.

2. The tunnel junction device according to claim 1, wherein the tunneling film comprising the three electrically insulating layers has a total thickness of three unit layers to ten unit layers.

3. The tunnel junction device according to claim 2, wherein the upper and lower layers constituting the tunneling film of the three-layer structure each have a thickness of one unit layer to three unit layers.

4. The tunnel junction device according to claim 2, wherein at least one of the layers constituting the tunneling film comprises an oxide film of a transition metal such as Mn, Fe, Co, Ni, or Cu.

5. The tunnel junction device according to claim 4, wherein at least one of the layers constituting the tunneling film comprises an $A_{1-x}B_xMO_{3-\delta}$ oxide, wherein X satisfies the condition: $0 \leq X \leq 1$; $\delta$ represents an oxygen deficiency; A represents an element selected from the group consisting of Ca, Sr, Ba, and other alkaline earth elements, La and other rare earth elements, elements comprising Y and Bi; B represents another element which is different from A, selected from the group consisting of Ca, Sr, Ba, and other alkaline earth elements, La and other rare earth elements, and oxides comprising Y and Bi; and M represents a transition metal such as Mn, Fe, Co, Ni, or Cu.

6. The tunnel junction device according to claim 5, wherein the core layer of the three insulating layers constituting the tunneling film comprises $SrTiO_{3-\delta}$ wherein $\delta$ represents an oxygen deficiency.

7. The tunnel junction device according to claim 6, wherein the upper and lower layers sandwiching the $SrTiO_{3-\delta}$ layer (wherein $\delta$ represents an oxygen deficiency) each comprise $La_{1-x}Sr_xMnO_{3-\delta}$ wherein the content x of Sr satisfies the condition: $0 \leq X \leq 0.4$; and $\delta$ represents an oxygen deficiency.

8. The tunnel junction device according to any one of claims 1 to 7, wherein the ferromagnetic electroconductive electrodes each comprise a $La_{1-x}Sr_xMnO_{3-\delta}$ oxide wherein X satisfies the condition: $0.2 \leq X \leq 0.5$; and $\delta$ represents an oxygen deficiency.

9. The tunnel junction device according to any one of claims 1 to 7, wherein the ferromagnetic electroconductive electrodes each comprise an $A_2MM'O_{6-\delta}$ oxide wherein X satisfies the condition: $0 \leq X \leq 1$; $\delta$ represents an oxygen deficiency; A represents an element selected from the group consisting of Ca, Sr, Ba, and other alkaline earth elements, La and other rare earth elements, and oxides comprising Y and Bi; M represents a transition metal element such as Mn, Fe, Co, Ni, or Cu; and M' represents another transition metal element such as Mn, Fe, Co, Ni, or Cu, M' being different from M.

10. The tunnel junction device according to any one of claims 1 to 9, wherein at least one of materials constituting the ferromagnetic electroconductive electrodes and the tunneling film is prepared by a laser abrasion process.

* * * * *